United States Patent
Kanazawa et al.

(10) Patent No.: US 6,587,986 B1
(45) Date of Patent: Jul. 1, 2003

(54) ERROR CORRECTING DECODER

(75) Inventors: Akihiro Kanazawa, Tokyo (JP); Morihisa Momona, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/473,188

(22) Filed: Dec. 28, 1999

(51) Int. Cl.7 .............................................. H03M 13/35
(52) U.S. Cl. ...................................................... 714/774
(58) Field of Search ................................. 714/774, 775

(56) References Cited

U.S. PATENT DOCUMENTS

| | | | | |
|---|---|---|---|---|
| 5,761,223 A | * | 6/1998 | Ando et al. | 714/774 |
| 5,771,226 A | * | 6/1998 | Kaku | 370/232 |
| 5,777,986 A | * | 7/1998 | Grossman | 370/235 |
| 5,781,542 A | * | 7/1998 | Tanaka et al. | 370/342 |
| 5,856,988 A | * | 1/1999 | Kiriyama | 714/701 |
| 5,862,178 A | * | 1/1999 | Jarvinen et al. | 375/240 |
| 5,951,709 A | * | 9/1999 | Tanaka | 370/280 |
| 6,175,871 B1 | * | 1/2001 | Schuster et al. | 370/252 |
| 6,182,264 B1 | * | 1/2001 | Ott | 714/774 |
| 6,320,850 B1 | * | 11/2001 | Perahia et al. | 370/248 |
| 6,366,959 B1 | * | 4/2002 | Sidhu et al. | 709/214 |

* cited by examiner

Primary Examiner—Stephen M. Baker
(74) Attorney, Agent, or Firm—Dickstein, Shapiro, Morin & Oshinsky, LLP.

(57) ABSTRACT

An error correcting decoder for decoding a plurality of block units of data, the data being encoded with a plurality of parameters, comprising a plurality of error correcting decoding circuits for inputting and outputting the block units of data and for performing error correction decoding for the block units of data on the basis of the plurality of parameters, a selection circuit for selecting one of the block units from an output of the plurality of error correction decoding circuits on the basis of the encoding parameters of the selected block, a delay circuit for adding delay to the output of the plurality of the plurality of error correction decoding circuits wherein the delay equalizes a time between the inputted plurality of block units of data and outputted plurality of the selected block units and a multiplexing circuit for outputting a multiplexed signal from a plurality of the selected block units in the same order as that of the inputted plurality of block units of data.

2 Claims, 4 Drawing Sheets

ERROR CORRECTING DECODER

BACKGROUND OF THE INVENTION

The present invention relates to an error correcting decoder for correcting code error caused by transmission or accumulation of a digital code.

Conventionally, error correcting decoders for decoding of a variable parameter block unit changes an encoding parameter by changing computations inside the decoder. Therefore, changing the encoding parameter of error correcting decoder is possible to a period lacking data during processing inside the decoder.

In data communications based on a variable length packet, usage efficiency of a line and noise tolerances are increased simultaneously by changing the parameter for error correction encoding according to the length of data frame. In order to realize such operation, information about frame length and the error correcting encoding parameter for use are previously adjusted in a transmission node and a receiving node and the error correcting encoding parameter may be changed according to the frame by changing the error correcting encoding parameter for every time of frame arrival.

However, it is restricted that the conventional error correcting encoder and the error correcting decoder, of which encoding parameters are variable, require a certain time for completion of encoding and decoding, and encoding parameters cannot be changed during the time. Therefore, performing error correction encoding processing and error correction decoding processing of a signal of which encoding parameters are frequently changed, particularly, performing error correction encoding processing and error correction decoding processing are difficult for a signal in which error correction encoding blocks of various encoding parameters arrive at the decoder with very small time intervals.

Different error correcting encoding parameters generally causes a change of processing time for error correction encoding and error correction decoding. Therefore, an output generated from an input, which has a mixture of error correction encoding blocks of various encoding parameters, subjected to error correction encoding end error correction decoding has a problem such that an order of encoding blocks is incorrectly outputted and that times for outputting a certain encoding block and other encoding blocks before and after overlap causing an abnormal output.

SUMMARY OF THE INVENTION

It is an object of the present invention to realize a function to perform error correction decoding of a signal of which encoding parameters change, particularly, a function to perform error correction decoding of a signal of which error correction encoding blocks of various encoding parameters arrive at the decoder with very small time intervals.

DETAILED DESCRIPTION OF THE PREFERRED EMBODIMENTS

Figure 1:
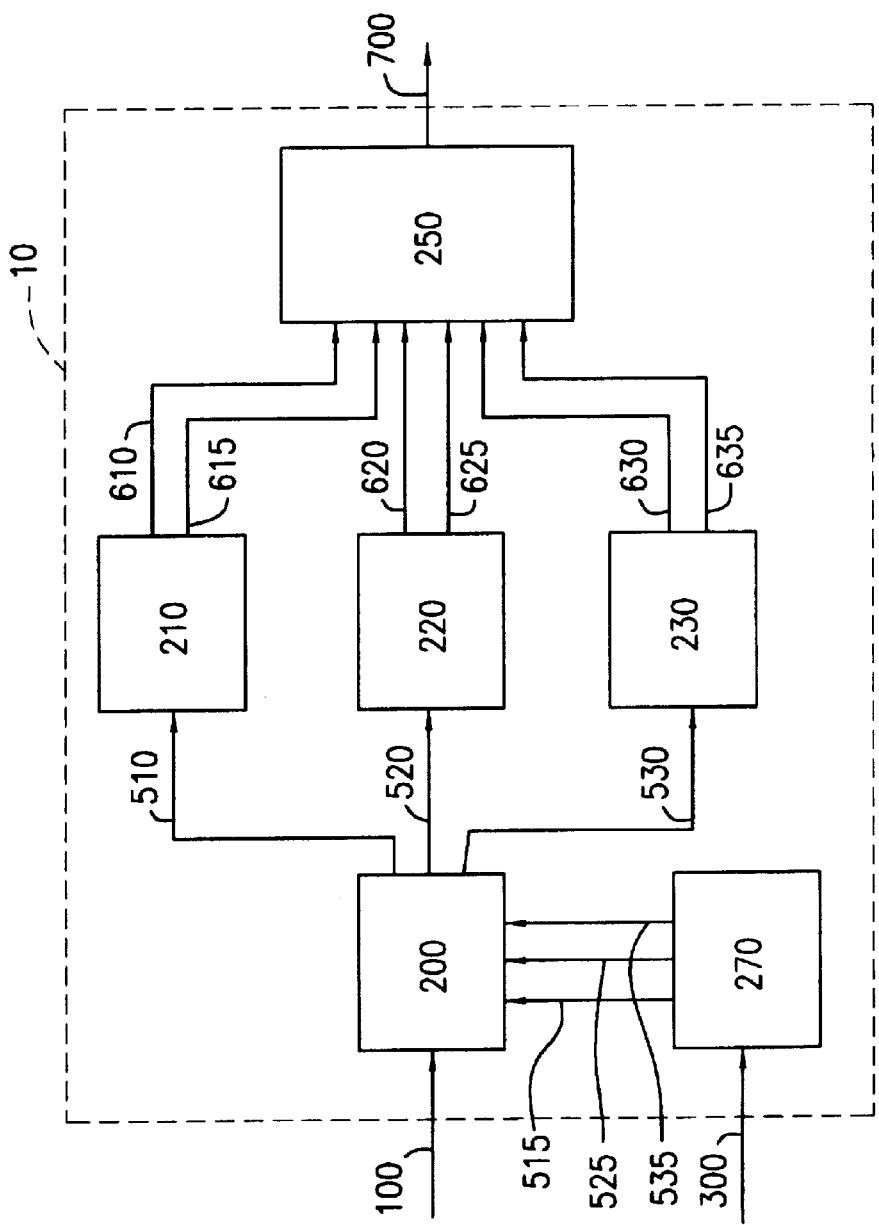
FIG. 1 is an example of an embodiment of the present invention.

The error correcting decoder 10 of the present invention is constituted by an input selection circuit 200 to divide destination of a signal and a plurality of the error correction decoding circuits 210, 220 and 230, and output selection circuit 230 to select the outputs of the error correction decoding circuit 210, 220, and 230, an input selection circuit 200, and a control circuit 270 to control the operation of the multiplexing circuit 250.

Figure 2:
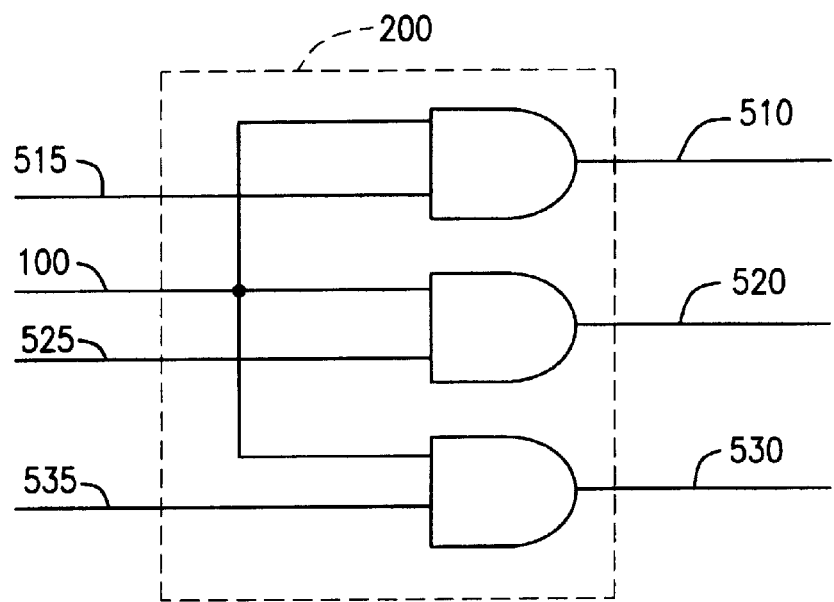
FIG. 2 is an example of an input selection circuit.
Figure 3:
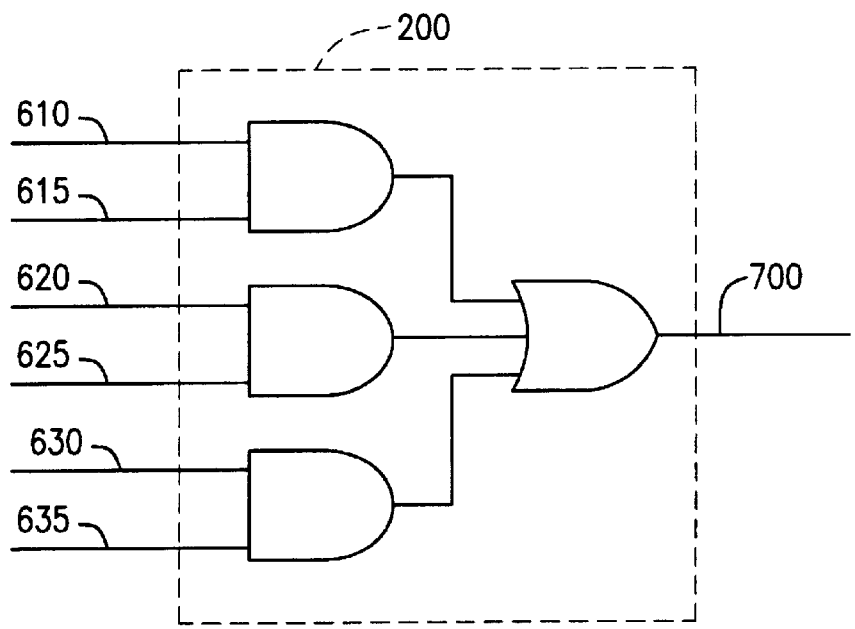
FIG. 3 is an example of an output selection circuit.

As the error correction decoding circuit 210, 220 and 230, specifically, existing error correction decoding circuits can be used. The selection circuit 200 is, specifically, realized by a gate circuit shown in FIG. 2 and outputs the input signal 100 among signals 510, 520 and 530 of which control signals 515, 525, and 525 have become active. Among control signals 515, 525 and 525, two or more signals do not become simultaneously active. The output selection circuit 250 is, specifically, realized by a gate circuit, namely a selector, shown in FIG. 3 and outputs by selecting a signal to make a pair [with activated ones] among the control signals 615, 625 and 635 among signals 610, 620 and 630 and 630 as an output signal 700.

The following is an operation of the first embodiment of the present invention. The blocks 110, 120 and 130 (not illustrated), that is inputted as an input signal 100 for error correction decoding, should be subjected to error correction encoding with respective different encoding parameters. Encoding parameter means a combination of the block length of error correction encoding, or the length of redundant code, or a calculation formula for performing error correction encoding. It is assumed that encoding parameter of the block 110 is p1, encoding parameter of block 120 is p2, and encoding parameter of block 130 is p3. Also, different encoding parameters are previously set such that the encoding parameter pi is for the error correction decoding circuit 210 and the encoding parameter p2 is for decoding function 220.

Subsequently, the determined time of input of the blocks 110, 120 and 130 to be subjected to error correction encoding and information 300 showing encoding blocks are inputted in a switching control function 270 generates control signals 515, 525 and 535 as the determined time of input of the blocks 110, 120 and 130 on the basis of information 300. Then, input selection circuit 200 switches a path for sending the blocks 110,120 and 130 to the error correction decoding circuit according to the control signals 515, 525 and 535.

For example, during the period in which the block 110 encoded with the encoding parameter p1 is being inputted, the signal 510 is sent to the error correction decoding circuit 210. If encoding block 120 encoded with the encoding parameter p2 is subsequently inputted, a selected signal is switched from the signal 510 to the signal 520 in a boundary between blocks 110 and 120. This is sent to the error correction decoding circuit 220. By such operation, when blocks of different encoding parameters arrive continually, the error correction decoding can be carried out by inputting a signal in the error correction decoding function corresponding to an appropriate encoding parameter.

Control signals 615, 625 and 635 of data enable showing an effective portion of data with synchronization with decoded signals 610, 620 and 630 are outputted from the error correction decoding circuit 210, 220 and 230. In the output selection circuit 250, one of signals 610, 620 and 630 are selected to output the block 710 (not illustrated) decoded for inputted block 110, the block 720 (not illustrated) decoded for inputted block 120, and the block 730 (not illustrated) decoded for inputted block 130 as an output signal 700 according to these data enable signals 615, 625 and 635 respectively.

In this case, data enable signals 615, 625 and 635 attach to outputted signals 610, 620 and 630 and the otuput signal is selected according to data enable signals. When the error correction decoding circuit is used for the error correction decoding circuit 210, 220 and 230, unless the data enable signals arc not output control signals 615, 625 and 635 compatible with data enable may be generated by the control circuit 270 wit the same timing as that of aforementioned.

If the error correction decoding circuit 210, 220 and 230 are capable of changing encoding parameters to process, decoding processing can be performed by a small number of the error correction decoding function. Specifically, these error correction decoding function 210, 220 and 230 can change encoding parameters to a time zone restricted to that without data during processing. Thus, after the error correction decoding circuit 210 finishes the decoding processing of the block 110 to complete outputting of the decoded block 710, setting of the error correction decoding circuit 210 is changed in accordance with encoding parameters of the block 130. After completion of setting change, the input selection circuit 200 is controlled to select the signal 510 for performing decoding of the block 130. By repeating the same operation, even when the encoding parameters are capable of being many different values, decoding processing can be performed by a limited number of the error correction decoding function.

Figure 4:
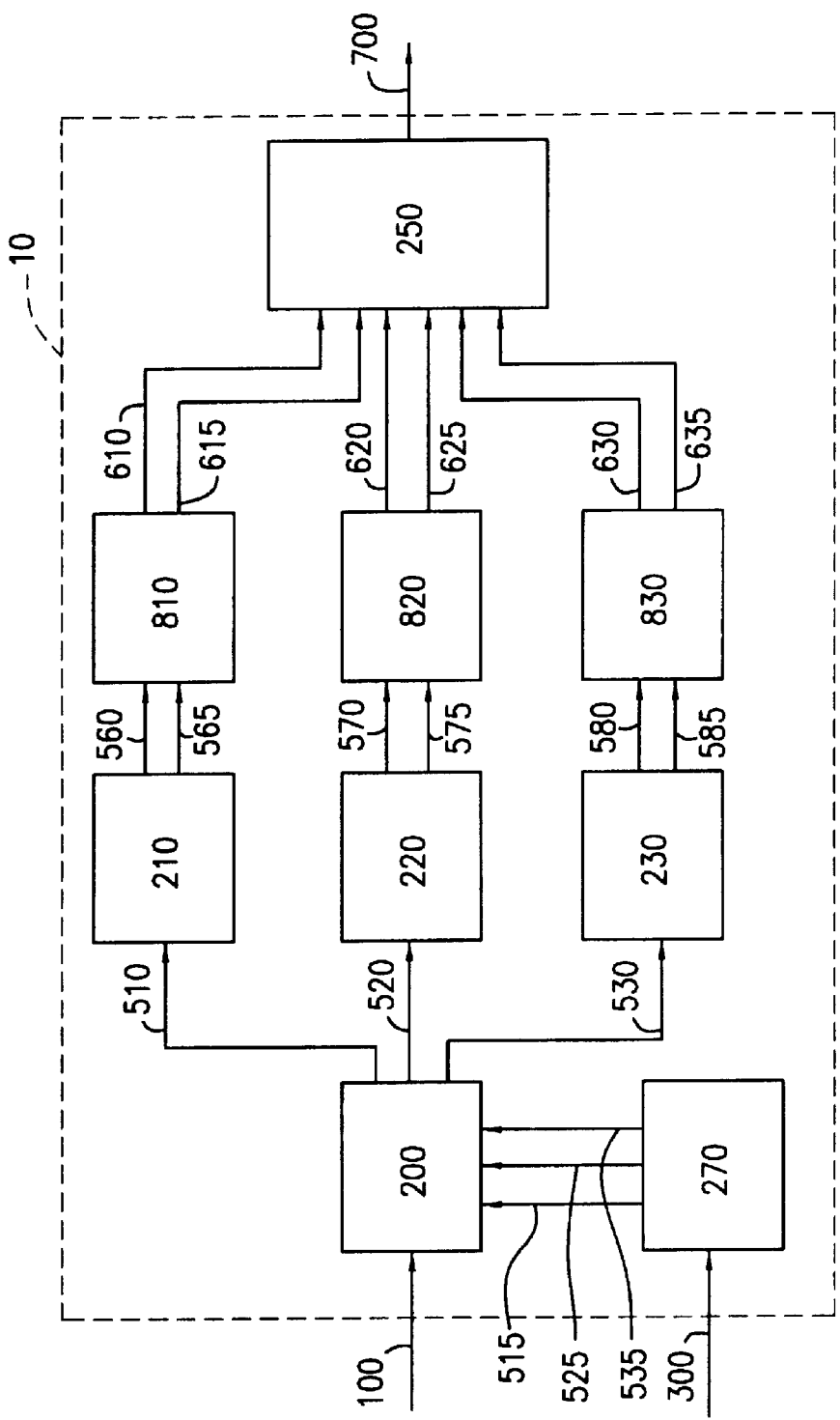
FIG. 4 is an example of another embodiment of the present invention.

FIG. 4 is a block diagram showing a second embodiment of the present invention, the second embodiment has delay circuits 810, 820 and 830 to delay an output signal of the error correction decoding circuit 210, 220 and 230. In the blocks 110,120 and 130, blocks subjected to error correction encoding with different encoding parameters have been mixed. In this case, it is assumed that encoding parameter of the block 110 is p1, encoding parameter of block 120 is p2, and encoding parameter of block 130 is p3.

Error correction encoding parameters which are diferent from each other are previously set such that the encoding parameter p1 is set for the error correction decoding circuit 210 and the encoding parameter p2 is set for decoding function 220. Time required for decoding the respective blocks may differ according to the encoding parameters. In addition, delay amounts d1, d2 and d3 designated by respective delay circuits 810, 820 and 830 are.set such that the sum of delay amounts of delay amounts of respective delay circuits and a pair of error correction decoding circuit is evenly set to make t0 value. For example, if it is assumed that processing delay amounts in error correction decoding circuit 210,220 and 230 making a pair with respective delay means are t1, t2, t3, respectively, setting is made to hold the following equations.

$t1+d1=0$ $t2+d2=0$ $t3+d3=0$

Subsequently, the determined time of input of the blocks 110, 120 and 130 to be subjected to error correction encoding, encoding parameters of the corresponding error correction encoding blocks, and information 300 showing length of data determined as to be inputted are inputted in the control circuit 270. The control circuit 270 then generates control signals 515, 525 and 535 at the determined time of input of the blocks 110, 120 and 130 on the basis of information 300. The input selection circuit 200 switches a path for sending inputted signals to the error correction decoding circuit according to the control signals 515, 525 and 535.

For example, when the block 110, encoded with the encoding parameter plis being inputted, the signal 510 is sent to the error correction decoding circuit 210. If encoding block 120 encoded with the encoding parameter p2 is subsequently inputted, the inputted signal is switched from 510 to 520 in a boundary between blocks 110 and 120. Thus, a signal is inputted in the error correction decoding circuit 210, 220 and 230 in a similar manner to that of the first mode of the invention. The signal 560, 570 and 580 from the error correction decoding circuit 210, 220 and 230 are input to the delay circuits 810, 820 and 830, respectively.

Signals 610, 620 and 630 from the delay circuits 810, 820 and 830 are output in a single signal 700 in the selection circuit 250. If data enable signals 565, 575 and 585 showing effective portions of output data are output from the error correction decoding circuit 210, 220 and 230 in parallel with data 560, 570 and 580, data path can be selected by using signals 615, 625 and 635 generated by delaying of data enable signals 565, 575 and 585 in the delay circuits 810, 820 and 830. This means that the block 710 (not illustrated) decoded for inputted block 110, the block 720 (not illustrated) decoded for inputted block 120, and the block 730 (not illustrated) decoded for inputted block 130 are outputted in this order using the output data from the delay circuit as an output signal 700 restricted to a period in which effective data is being input.

In aforementioned description, it is stated that selection of input in the output selection circuit is carried out by using signals 615, 625 and 635 showing effective portions of data. However, it may be possible to generate a control signal separately by using information for selection of an output signal path with suitable timing. For instance, information designating the error correction decoding function determined to be used, information showing time determined as respective encoding blocks are input and data length determined to be input, a flag showing arrival of a signal in a determined time schedule, and information of a delay time occurred in respective paths allows generating a signal for selection of a signal path.

Figure 5:
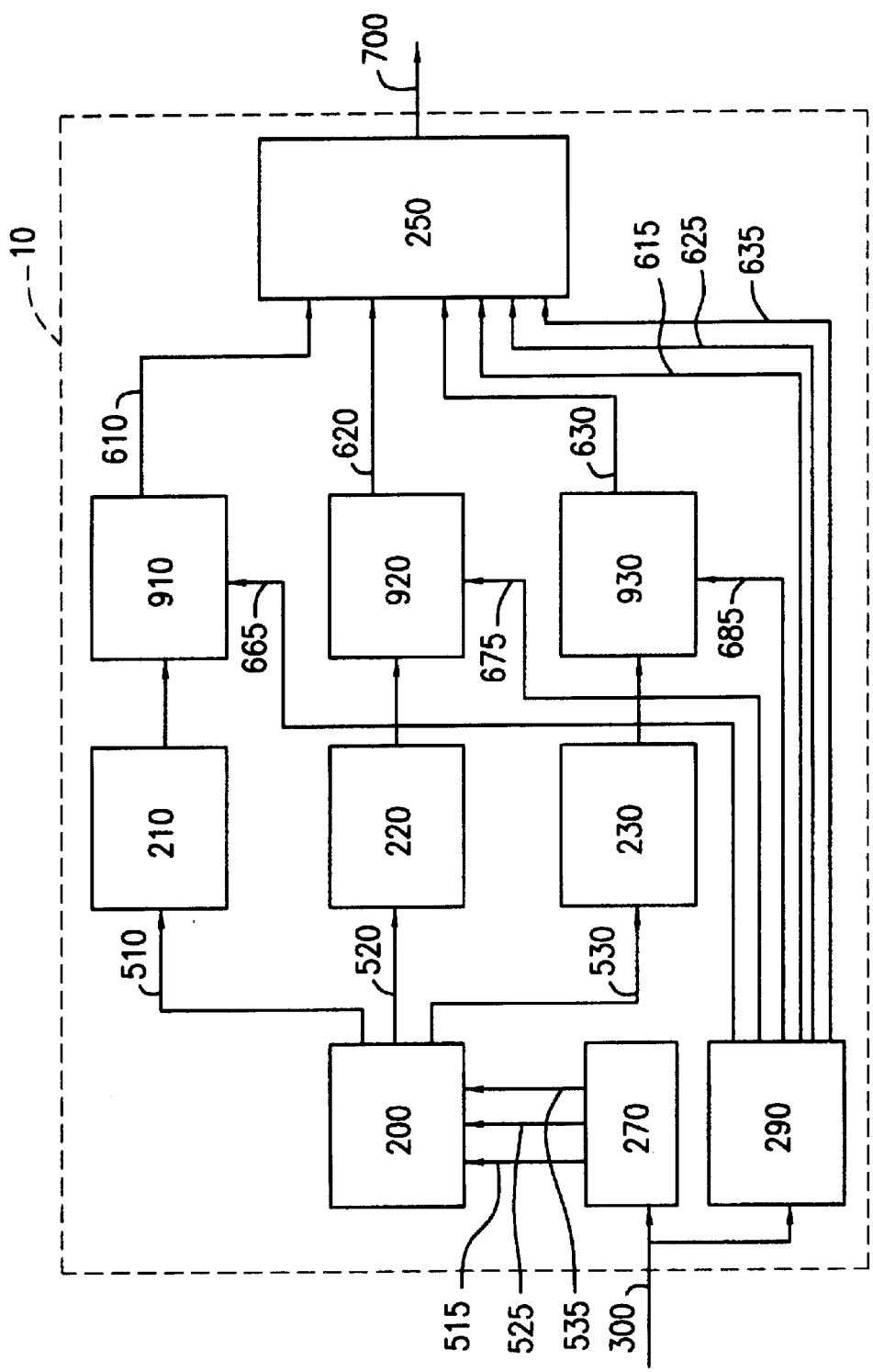
FIG. 5 is an example of another embodiment of the present invention.

FIG. 5 is a block diagram showing another embodiment of the present invention. In this embodiment buffer memories 910, 920 and 930 store temporarily the outputs of the error correction decoding circuit 210,.220 and 230 and a control signal generating circuit 290 to generate control signal for reading from the buffer memories. The buffer memories 910, 920, and 930 are specifically, realized by using FIFO memory The blocks 110, 120 and 130 input to be subjected to error correction encoding have mixtures of blocks subjected to error correction encoding with different encoding parameters. Herewith, it is assumed that encoding parameter of the block 110, is p1, encoding parameter of block 120 is p2, and encoding parameter of block 130 is p3.

Error encoding parameters which are from each other are previously set such that the encoding parameter p1 is set for the error correction decoding circuit 210 and the encoding parameter p2 is set for decoding function 220. The time that is required for decoding of respective encoding blocks could be changed according to encoding parameters.

Subsequently, the determined time of input of the blocks 110, 120 and 130, encoding parameters of corresponding blocks to be subjected to error correction encoding, and information 300 showings length of data determined to be input are input in the control circuit 270. The control circuit 270 generates control signals 515, 525 and 535 at the determined time of input of the blocks 110, 120 and 130 on the basis of information 800. The input selection circuit 200 switches a path for sending inputted signals to the error correction decoding circuit according to the control signals 515, 525 and 535.

For example, during the period in which the block 110 encoded with the encoding parameter p1 is being inputted, the signal 510 is selected as a signal path through which an input signal is sent. If block 120 encoded with the encoding parameter p2 is subsequently inputted, the signal path is switched from 510 to 520 in a boundary between encoding blocks 110 and 120. Thus, a signal is inputted in the error correction decoding circuit 210, 220 and 230 by similar manner as those of the first and second modes of carrying out the invention. The output from the error correction decoding circuit 210, 220 and 230 are accumulated in the buffer memories 910, 920 and 930, respectively.

On the other hand, in the control signal generating circuit 290, signals 615, 625 and 635 showing effective portions of signals 610, 620 and 630, which are read from control signals 665, 675 and 685 to read signals from buffer memories 910, 920 and 930 and the buffer memories, are generated with an appropriate timing on the basis of information showing length of the block 110, 120 and 130 inputted and timing of input and which error correction function used. Generated control signals 663, 675 for reading is sent to buffer memories 910, 920 and 930. As a result, signals 610, 620 and 630 read from buffer memories 910, 920 and 930 are output after compiling in a single output signal 700 in the output selection circuit 250.

In the above description, length of the block 110,120 and 130 actually input in the error correction decoding circuit 210, 220 and 230 and timing of input and which error correction function used. Other information may be used if it is necessary and sufficient to read for only a necessary length from the buffer with a correct timing. For instance, using information designating the error correction decoding function determined as to be used, information showing time determined as respective encoding blocks are inputted and data length determined as to be inputted, and a flag showing arrival of a signal in a determined time schedule allows realizing a compatible function with the aforementioned.

Examples of constitution of the error correcting decoder as the first to third embodiments of the present invention have been described herewith. Replacing the.error correcting decoding circuit to the error correcting encoding circuit in the same constitution allows realizing the error correcting encoder usable for a signal in which a plurality of encoding parameters have been mixed.

The first effect of the present invention is to make possible error correcting decoding of a data series, which was difficult to process by conventional error correcting decoder, and of which encoding parameters of a encoding blocks differ from each encoding block. Here, encoding parameter is defined as a block length of error correcting encoding or a length of redundant code, or a calculation formula used for encoding processing.

In the second effect of the present invention, using error correction decoding circuit in which processing time for error correction decoding changes according to error correcting encoding parameters allows absorption of a difference in process time occurred during error correction decoding of data series in which encoding parameters differs in respective encoding blocks in order to yield serially the result of error correction encoding and error correction decoding in the correct order.

What is claimed is:

1. An error correcting decoder for decoding a plurality of block units of data, said data being encoded with plurality of parameters, comprising:

a plurality of error correcting-decoding circuits for inputting and outputting said block units of data and for performing error correction decoding for said block units of data on the basis of said plurality of parameters;

a delay circuit for adding delay to said output of said plurality of error correction decoding circuits wherein said delay corresponds a time between each of said outputted plurality of block units of data to each of said inputted plurality of block units of data;

a selection circuit for selecting one of said block units from an output of said delay circuit on the basis of said encoding parameters of the selected block; and a multiplexing circuit for outputting a multiplexed signal from a plurality of said selected block units.

2. An error correcting decoder for decoding a plurality of block units of data, said data being encoded with plurality of parameters, comprising:

a plurality of error correcting decoding circuits for inputting and outputting said block units of data and for performing error-correction decoding for said block units of data on the basis of said plurality of parameters;

a selection circuit for selecting one of said block units from an output of said plurality of error correcting decoding circuits on the basis of said encoding parameters of the selected block;

a plurality of first memory devices for temporarily storing signals outputted from said plurality of error correction decoding circuits;

a second memory device for storing said signals inputted to the error correction decoder based upon the order in which said signals are inputted;

a reading device for reading said outputted signal in said plurality of first memory devices based upon said order in said second memory device; and a multiplexing circuit for outputting a multiplexed signal read out from said reading device.

* * * * *